(12) United States Patent
Mangrum

(10) Patent No.: US 8,501,023 B2
(45) Date of Patent: Aug. 6, 2013

(54) METHOD FOR FORMING A MIRROR MEMS DEVICE

(75) Inventor: Brett A. Mangrum, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/323,466

(22) Filed: Dec. 12, 2011

(65) Prior Publication Data

US 2012/0285925 A1    Nov. 15, 2012

Related U.S. Application Data

(63) Continuation of application No. 11/439,684, filed on May 24, 2006, now abandoned.

(51) Int. Cl.
*B29D 11/00*    (2006.01)

(52) U.S. Cl.
USPC ............. 216/24; 216/31; 216/75; 438/720; 438/723

(58) Field of Classification Search
USPC .............. 216/24, 26, 39, 40, 79, 80, 2, 17, 216/31, 66, 75, 100; 438/719, 754, 697, 720, 438/723; 359/224.1, 248
See application file for complete search history.

(56) References Cited

U.S. PATENT DOCUMENTS

| | | | |
|---|---|---|---|
| 6,942,814 B2 * | 9/2005 | Wood et al. | 216/24 |
| 7,011,415 B2 | 3/2006 | DiCarlo et al. | |
| 7,064,883 B2 | 6/2006 | Payne et al. | |
| 7,075,701 B2 * | 7/2006 | Novotny et al. | 359/291 |
| 2005/0176212 A1 | 8/2005 | Monroe et al. | |
| 2005/0260793 A1 | 11/2005 | Patel et al. | |
| 2005/0280883 A1 * | 12/2005 | Seo et al. | 359/29 |

* cited by examiner

*Primary Examiner* — Lan Vinh
(74) *Attorney, Agent, or Firm* — Warren L. Franz; Wade J. Brady, III; Frederick J. Telecky, Jr.

(57) ABSTRACT

An apparatus for use with a digital micromirror device includes a hinge layer that is disposed outwardly from a substrate. The hinge layer including a hinge that is capable of at least partially supporting a micromirror that is disposed outwardly from the hinge. In one particular embodiment, the hinge and the substrate are separated by a first air gap. The device also including a first hinge support that is disposed outwardly from the substrate and inwardly from at least a portion of the hinge layer. The first hinge support being capable of transmitting a voltage to the hinge. At least a portion of the hinge support coupled to at least the portion of the hinge layer. In one particular embodiment, the first hinge support is formed in a process step that is different than a process step that forms the hinge layer.

4 Claims, 3 Drawing Sheets

METHOD FOR FORMING A MIRROR MEMS DEVICE

This is a continuation of application Ser. No. 11/439,684, filed May 24, 2006, the entirety of which is hereby incorporated by reference.

BACKGROUND OF THE INVENTION

This relates in general to spatial light modulators and, in particular, to a digital micromirror device having an improved hinge assembly and a method of manufacturing the same.

Digital micromirror devices (DMD) and other micro-electromechanical systems (MEMS) are used in optical communication and/or projection display systems. DMDs have an array of micromirrors that selectively communicate at least a portion of an optical signal or light beam by pivoting between "on" and "off" states. Conventional DMDs typically include hinges supported by hinge posts improvements to which may improve the reliability of the conventional DMD in a variety of ways.

SUMMARY

In one embodiment, a digital micromirror device comprises a hinge layer disposed outwardly from a substrate, the hinge layer comprising a hinge capable of at least partially supporting a micromirror disposed outwardly from the hinge. The hinge and the substrate are separated by a first air gap. The device also comprises a first hinge support disposed outwardly from the substrate and inwardly from at least a portion of the hinge layer. The first hinge support is capable of transmitting a voltage to the hinge. At least a portion of the hinge support couples to at least the portion of the hinge layer. The first hinge support is formed in a process step that is different than a process step that forms the hinge layer.

In a method embodiment, a method of forming an apparatus for use with a MEMS device comprises forming a first conductive layer disposed outwardly from a substrate, the first conductive layer comprising a height. In addition, the method comprises forming a spacer layer within the first conductive layer, the spacer layer comprising a height of no more than the height of the first conductive layer. The method also comprises forming a first hinge support within the first conductive layer, the first hinge support comprising a height of approximately the height of the first conductive layer. The method further comprises forming a hinge layer disposed outwardly from at least a portion of the first hinge support and at least a portion of the spacer layer, the hinge layer comprising a hinge capable of at least partially supporting a micromirror disposed outwardly from the hinge. The hinge layer is formed in a process step that is different than a process step that forms the first hinge support.

Depending on the specific features implemented, particular embodiments provide enhanced structural rigidity and may enhance or improve conductive coupling between the MEMS superstructure and control circuitry.

BRIEF DESCRIPTION OF THE DRAWINGS

Example embodiments are described with reference to accompanying drawings, wherein.

DETAILED DESCRIPTION OF EXAMPLE EMBODIMENTS

Particular examples and dimensions given herein are for illustrative purposes only, and are not intended to limit the scope of the disclosure. Drawings are not intended to be to scale. Also, the disclosure is not intended to be limited to a particular micro-electromechanical system device in a spatial light modulator application, such as, a digital micromirror device. Moreover, the illustrations in FIGS. 1 and 2A through 2F are not intended to be to scale.

Figure 1:
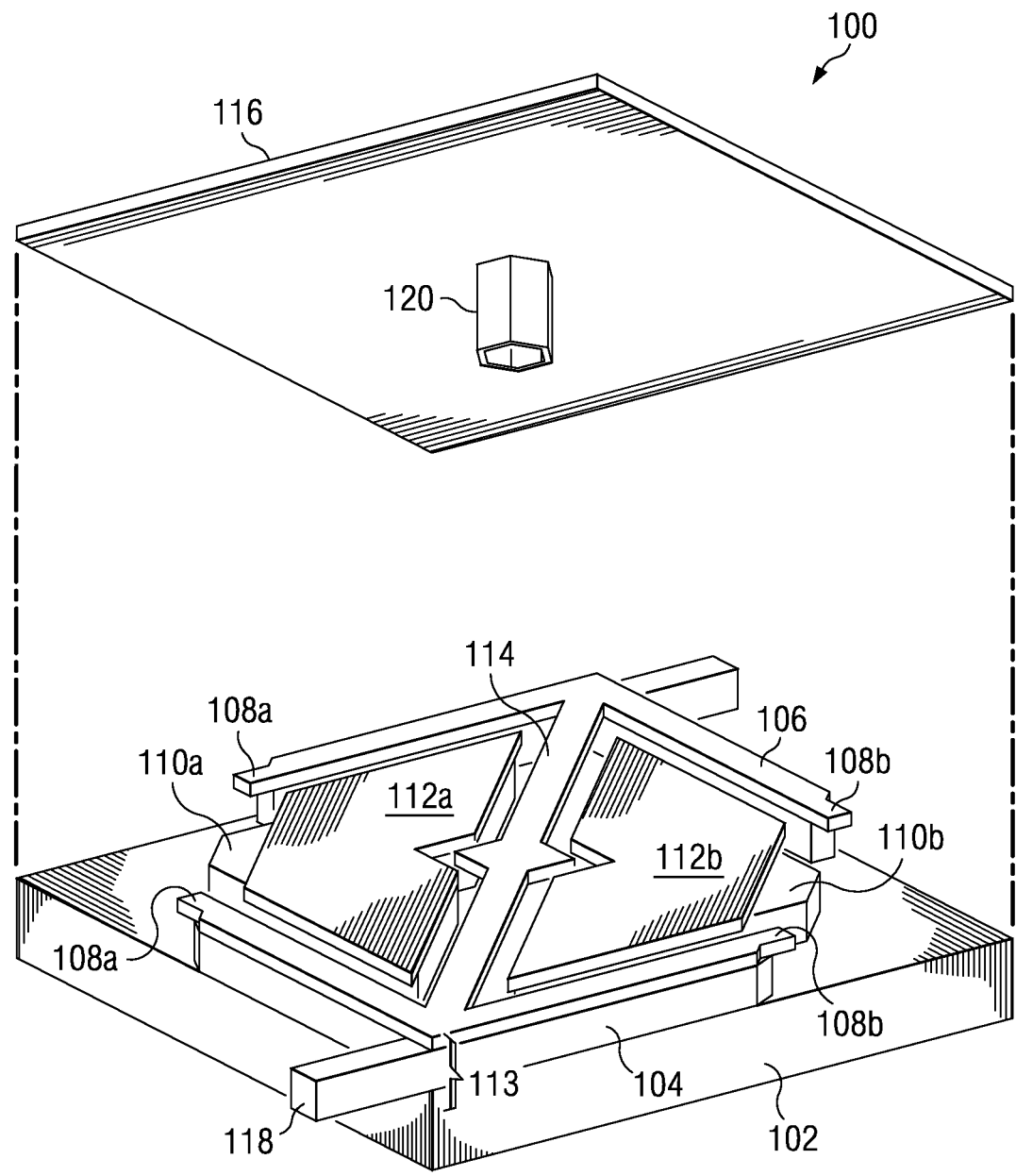
FIG. 1 is a perspective view of a portion of an embodiment of a digital micromirror device.

FIG. 1 illustrates an example embodiment of a digital micromirror (DMD) device 100. In this example, DMD 100 comprises a device that includes an array of hundreds of thousands of micromirrors (e.g., micromirror 116). In this example, micromirror 116 is approximately 13.8 square μm in size and spaced by a 1 μm gap from adjacent micromirrors. Although micromirror 116 comprises approximately 13.8 square μm and has less than a 1 μm spacing between adjacent micromirrors in this example, other dimensions, shapes or spacing may be used without departing from the scope of the disclosure. For example, micromirror 116 can be less than 13 square μm in size. In addition, micromirror 116 may tilt up to plus or minus twelve degrees creating an "on" state condition or an "off" state condition. Although micromirror 116 may tilt up to plus or minus twelve degrees in this example, any appropriate tilt angle may be used without departing from the scope of the disclosure.

In this example, micromirror 116 transitions between its "on" and "off" states to selectively communicate at least a portion of an optical signal or light beam. To permit micromirror 116 to tilt, micromirror 116 is coupled to one or more hinges 114. In this example, hinge 114 is coupled to a hinge support 104 that is disposed outwardly from a complementary metal-oxide semiconductor (CMOS) substrate 102. In this example, micromirror 116 tilts in the positive or negative direction until it contacts spring tip pairs 108a or 108b respectively. Although this example includes spring tip pairs 108, other examples may eliminate spring tip pairs 108. In those examples, micromirror 116 tilts in the positive or negative direction until micromirror 116 contacts a mirror stop (not explicitly shown).

In this particular example, DMD 100 also includes first electrodes 110a and 110b, conductive conduits 118, and second electrodes 112a and 112b. In this example, hinge support 104, first electrodes 110a and 110b, and conductive conduits 118 are disposed outwardly from substrate 102, while second electrodes 112a and 112b, hinge layer 106, hinge 114, and spring tip pairs 108 are disposed outwardly from hinge support 104. In this particular embodiment, hinge 114 and spring tip pairs 108 are formed within hinge layer 106.

Hinge support 104 receives a bias voltage that at least partially contributes to the creation of electrostatic forces between first electrodes 110, second electrodes 112 and/or micromirror 116. In this particular example, a latching bias voltage comprises a steady-state voltage. That is, the bias voltage applied to hinge support 104 remains substantially constant while micromirror 116 is in an "on-state" or "off-state" position. In this example, the bias voltage comprises approximately twenty-six volts. Although this example uses a bias voltage of twenty-six volts, other bias voltages may be used without departing from the scope of the disclosure.

In this particular example, CMOS substrate 102 comprises control circuitry associated with DMD 100. The control circuitry can comprise any hardware, software, firmware, or combination thereof capable of at least partially contributing to the creation of the electrostatic forces between first electrodes 110, second electrodes 112 and/or micromirror 116. The control circuitry associated with CMOS substrate 102 functions to selectively transition micromirror 116 between its "on" state and "off" state based at least in part on data received from a processor (not explicitly shown). In this example, the control circuitry transitions micromirror 116 between "on" and "off" states by selectively applying a control voltage to at least one first electrode 110 coupled to one second electrode 112 associated with a particular micromirror 116. For example, to transition micromirror 116 from the "off" state to the "on" state condition, the control circuitry applies the control voltage to electrodes 110b and 112b, and removes the control voltage from electrodes 110a and 112a. In this example, the control voltage comprises approximately three volts. Although this example uses a control voltage of approximately three volts, other control voltages may be used without departing from the scope of the disclosure.

During operation, the application of the control voltage to particular pairs of electrodes (e.g., 110a and 112a) creates a voltage differential between micromirror 116 and at least a particular pair of electrodes. This voltage differential creates electrostatic forces between micromirror 102 and the particular pair of electrodes, which causes micromirror 102 to transition between "on" and "off" states. The magnitude of the electrostatic force is based at least in part on the area of micromirror 102, the area of electrodes 110 and 112, and the air gaps between electrodes 110 and 112, and micromirror 102.

Conventional DMDs typically include a hinge that is supported by hinge posts. In most cases, these hinge posts are hollow and are formed at the same time the hinge is formed. In some cases, these hinge posts may affect design parameters, performance, and reliability of the DMD. For example, hinge posts typically have extremely small metal sidewall coverage at their base, resulting in relatively poor conductivity. Poor conductivity can limit the voltages that tend to propagate through the hinge posts, which, in turn, can limit the operation of the DMD.

Unlike conventional DMDs, DMD 100 comprises a hinge stack 113 that is sufficiently thick to support hinge 114 while maintaining sufficient clearance between the corners of micromirror 116 and substrate 102 for digital operation. As used throughout this document, the phrase "hinge stack" refers to a combination of conductive materials that forms the support for hinge 114. In this particular embodiment, hinge stack 113 comprises a portion of hinge support 104 and at least the portion of hinge layer 106 disposed outwardly from hinge support 104. Although hinge stack 113 comprises a portion of hinge support 104 and at least a portion of hinge layer 106 in this example, hinge stack 113 can comprise any other desired layers without departing from the scope of the disclosure.

In some embodiments, hinge stack 113 can comprise a substantially conductive material over a cross-section of the hinge stack 113. That is, unlike the conventional hinge posts that are substantially hollow or have a substantially non-conductive cross-section, hinge stack 113 comprises a cross-section that comprises substantially conductive material. In most cases, hinge stack 113 significantly enhances the conductive coupling for the voltages associated with digital operation of DMD 100, thereby improving switching speed, latching strength, and reliability. In addition, hinge stack 113 provides a more rigid support structure for hinge 114.

In this example, the dimensions of electrodes 110 and 112 in this example do not perfectly overlap. This embodiment illustrates, in part, electrode dimensions that facilitate a complete selective removal of hinge support 104 without compromising electrostatic field coupling between micromirror 116 and electrodes 110 and 112.

One aspect of this disclosure recognizes that forming hinge support 104 and hinge stack 113 enables significant design flexibility. For example, hinge 114 may be significantly thinned without conductivity restraints. In addition, dimensions hinge support 104 and hinge layer 106 may be designed without having to make allowances for hinge post via dimensions or rigidity concerns.

In other embodiments, electrostatic coupling may be significantly enhanced by extending electrodes 110 and 112 the entire length of the pixel cell in a direction parallel to hinge 114. Although separating spring tips 108 and hinge support 104 from the conductive conduit 118 would create "floating" spring tips, the portion of the hinge support 104 supporting each spring tip could be coupled to the bias 118 through routing within substrate 102.

This disclosure not only illustrates example embodiments of DMD 100 with significant performance and reliability improvements, FIG. 2 illustrates example methods of forming DMD 100 that may reduce the total number of process steps associated with forming conventional DMDs.

FIGS. 2A through 2E illustrate an example method of forming a digital micromirror device (DMD) 200. DMD 200 may be used as a basis for forming any of a variety of optical devices, such as a spatial light modulator, a gain equalizer, an optical filter, or combination of these or other optical devices.

Figure 2A:
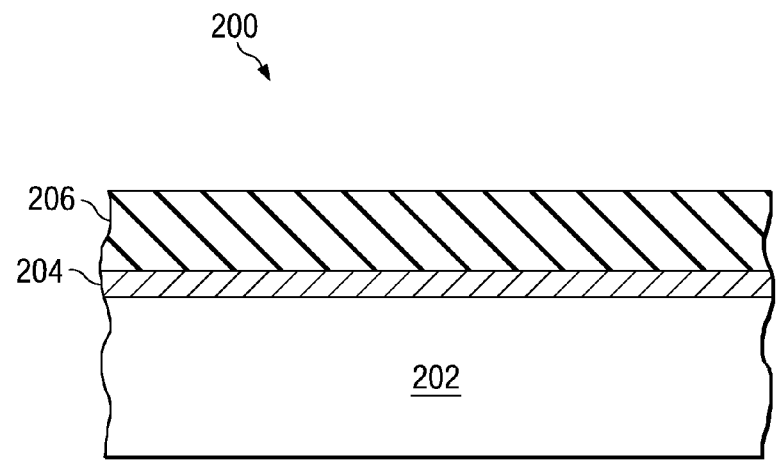
FIGS. 2A through 2F are cross-sectional views illustrating an example method of forming a digital micromirror device.

FIG. 2A shows a DMD 200 after the formation of a dielectric layer 204 disposed outwardly from a substrate 202, and after formation of a first conductive layer 206 disposed outwardly from dielectric layer 204. Although substrate 202 and dielectric layer 204 are shown as being formed without interstitial layers between them, such interstitial layers could alternatively be formed without departing from the scope of the disclosure.

Substrate 202 may comprise any suitable material used in semiconductor chip fabrication, such as silicon, polysilicon, indium phosphide, germanium, or gallium arsenide. In various embodiments, substrate 202 can include complementary metal-oxide semiconductor (CMOS) circuitry capable of controlling DMD 200 after its formation. In one non-limiting example, the CMOS circuitry may comprise a CMOS memory circuit, such as, for example, a 5T or 6T SRAM cell.

Dielectric layer 204 may comprise, for example, oxide, silicon dioxide, or oxi-nitride. Forming dielectric layer 204 may be effected through any of a variety of processes. In one non-limiting example, dielectric layer 204 can be formed by depositing an oxide on substrate 202. In some cases, the deposited oxide can be planarized, such as by using a chemical mechanical polish (CMP) technique. Planarizing a deposited oxide layer can advantageously provide a relatively flat surface.

First conductive layer 206 may comprise, for example, aluminum, an aluminum alloy or other conductive material. Where first conductive layer 206 comprises an aluminum alloy, the aluminum alloy may comprise, for example, aluminum, silicon, polysilicon, tungsten, nitride, and/or a combination of these or other conductive materials. In this example, first conductive layer 206 comprises silicon-based aluminum that has light absorbing and/or anti-reflective properties. In other embodiments, first conductive layer 206 may include a dielectric material with anti-reflective properties disposed outwardly from the silicon-based aluminum layer. Forming first conductive layer 206 may be effected through any of a variety of processes, for example, by depositing aluminum or an aluminum alloy. In some cases, first conductive layer 206 can be formed by depositing 1 μm of an aluminum alloy, such as silicon-based aluminum. Although dielectric layer 204 and first conductive layer 206 are shown as being formed without interstitial layers between them, such interstitial layers could alternatively be formed without departing from the scope of the disclosure.

Figure 2B:
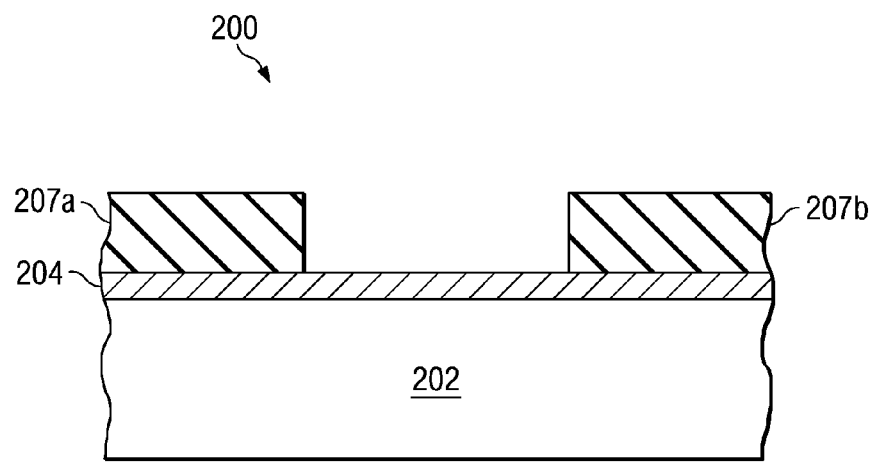

FIG. 2B shows DMD 200 after formation of hinge supports 207 within first conductive layer 206. Forming hinge supports 207 may be effected through any of a variety of processes. For example, hinge supports 207 may be formed by patterning and etching first conductive layer 206. In various embodiments, hinge supports 207, can be substantially similar in structure and function to hinge support 104 of FIG. 1.

At some point, one or more electrodes and conductive conduits (not explicitly shown) associated with DMD 200 are formed within first conductive layer 206. Forming the conductive conduits and the one or more electrodes may be effected through any of a variety of processes. For example, the conductive conduits and one or more electrodes may be formed by removing a portion of first conductive layer 206. In this particular embodiment, the conductive conduits and one or more electrodes are formed, for example, by patterning and etching first conductive layer 206. In some cases, the conductive conduits and one or more electrodes can be formed substantially simultaneously. In other embodiments, the conductive conduits and one or more electrodes can be formed subsequent to one another. In various embodiments, the conductive conduits and one or more electrodes formed in first conductive layer 206 can be substantially similar in structure and function as conductive conduits 114 and first electrodes 112 of FIG. 1.

Figure 2C:
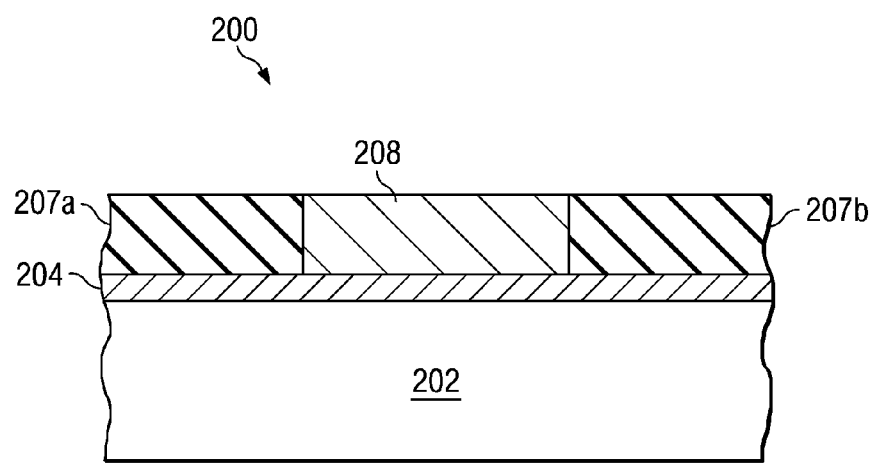

FIG. 2C shows DMD 200 after formation of a first spacer layer 208 disposed outwardly from substrate 202. First spacer layer 208 may comprise, for example, oxide, hardened photoresist, or other material that may be selectively removed. That is, first spacer layer 208 can be selectively removed using any number of processes, such as, for example, by performing a plasma-ash that does not significantly affect hinge supports 207 and/or dielectric layer 204.

Forming first spacer layer 208 may be effected through any of a variety of processes. In one non-limiting example, first spacer layer 208 can be formed by depositing oxide or photoresist material. In some cases, first spacer layer can comprise a thickness greater than a thickness of hinge supports 207. In those cases, the oxide can be polished to approximately the thickness of hinge supports 207, such as, for example, by using a chemical-mechanical polishing (CMP) technique that endpoints on the friction induced by the first conductive layer 206 surface. Although first spacer layer 208 and dielectric layer 204 are shown as being formed without interstitial layers between them, such first spacer and dielectric layers could alternatively be formed with interstitial layers without departing from the scope of the disclosure.

In other embodiments, first spacer layer 208 may alternatively be partially etched in combination with a CMP polish, or in lieu of a CMP polish, in order to reduce the first spacer layer 208 thickness to slightly less than a thickness of hinge supports 207. Such an embodiment may more advantageously prepare the surface of first spacer layer 208 in preparation for depositing hinge metal by creating a "sagging" profile for the hinge center in relation to where the hinge couples to hinge supports 207.

Figure 2D:
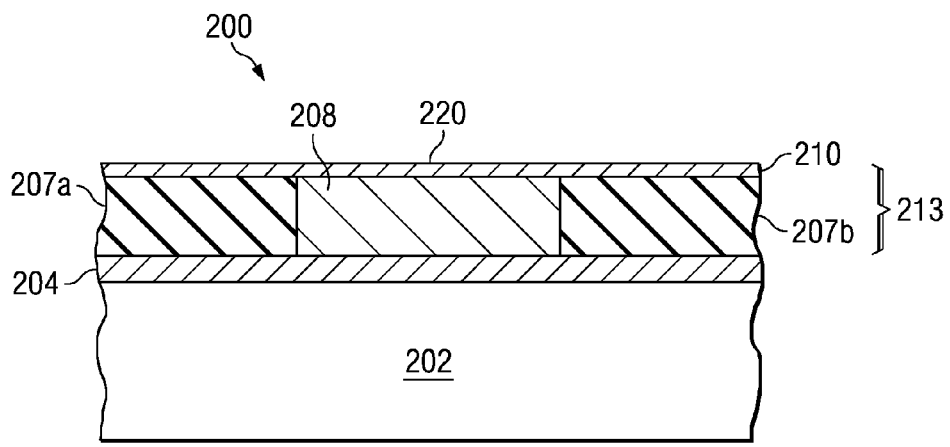

FIG. 2D shows DMD 200 after the formation of a hinge layer 210 disposed outwardly from hinge supports 207 and after formation of a hinge 220 disposed outwardly from first spacer layer 208. Although hinge layer 210 and hinge supports 207, and hinge 220 and spacer layer 208 are shown as being formed without interstitial layers between them, such interstitial could alternatively be formed without departing from the scope of the disclosure.

Hinge layer 210 and hinge 220 may comprise, for example, aluminum, oxygen, titanium, silicon, polysilicon, tungsten, nitride, and/or a combination of these or other materials. In this example, hinge layer 210 and hinge 220 comprise an aluminum alloy that has reflective properties. In other examples, hinge layer 210 and hinge 220 could comprise an aluminum compound that has light absorbing and/or anti-reflective properties. Although hinge layer 210 and hinge 220 comprise the same material in this example, hinge layer 210 and hinge 220 could comprise different materials without departing from the scope of the disclosure.

Forming hinge layer 210 and hinge 220 may be effected through any of a variety of processes. For example, hinge layer 210 and hinge 220 can be formed by removing a portion of a second conductive layer formed outwardly of hinge supports 207 and spacer layer 208. In this particular embodiment, the hinge layer 210 and hinge 220 are formed by patterning and etching the second conductive layer. In some cases, hinge layer 210 and hinge 220 can be formed substantially simultaneously. In other embodiments, hinge layer 210 and hinge 220 can be formed subsequent to one another. In various embodiments, hinge layer 210 and hinge 220 can be substantially similar in structure and function as hinge layer 106 and hinge 114 of FIG. 1.

Forming the second conductive layer may be effected through any of a variety of processes. For example, the second conductive layer can be formed by depositing an aluminum alloy. In some cases, the second conductive layer can be formed by depositing 500 angstroms of an aluminum alloy, such as AlTiO.

Unlike conventional DMDs, DMD 200 comprises a hinge stack 213 that is sufficiently thick to support hinge 220 while maintaining sufficient clearance between the corners of a micromirror (not explicitly shown) and substrate 202. In this particular embodiment, hinge stack 213 comprises a portion of hinge support 207 and at least the portion of hinge layer 210 disposed outwardly from hinge support 207. Although hinge stack 213 comprises a portion of hinge support 207 and at least a portion of hinge layer 210 in this example, hinge stack 213 can comprise any other desired layers without departing from the scope of the disclosure. In various embodiments, hinge stack 213 can be substantially similar in structure and function to hinge stack 113 of FIG. 1.

At some point, one or more electrodes and spring tip pairs associated with DMD 200 are formed within the second conductive layer. Forming the one or more electrodes and spring tip pairs may be effected through any of a variety of processes. For example, the one or more electrodes and spring tip pairs may be formed by removing a portion of the second conductive layer. In this particular embodiment, the one or more electrodes and spring tip pairs are formed by patterning and etching the second conductive layer. In some cases, the one or more electrodes and spring tip pairs can be formed substantially simultaneously. In other embodiments, the one or more electrodes and spring tip pairs can be formed subsequent to one another. In various embodiments, the one or more electrodes and spring tip pairs can be substantially similar in structure and function as second electrodes 112*a* and 112*b*, and spring tip pairs 108 of FIG. 1.

Figure 2E:
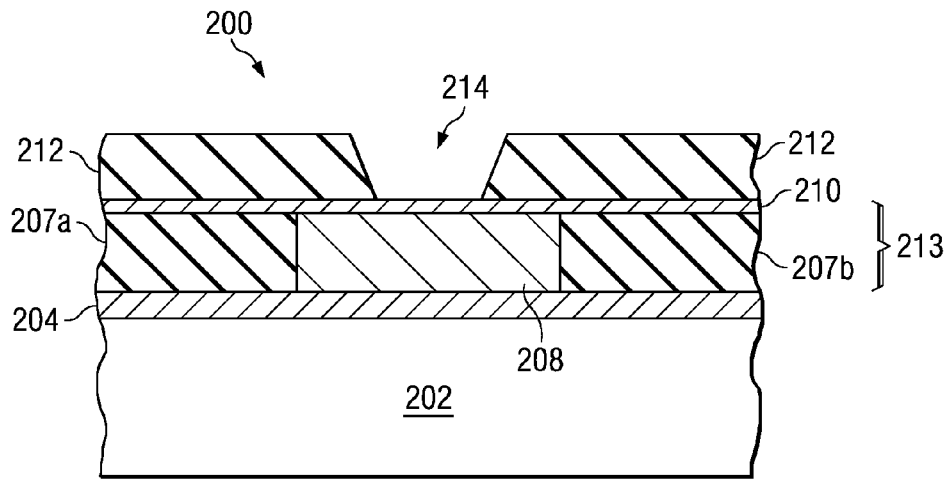

FIG. 2E shows DMD 200 after the formation of second spacer layer 212 disposed outwardly from hinge layer 210 and hinge 220, and after formation of a mirror via 214 within spacer layer 212. Although second spacer layer 212 and hinge layer 210 are shown as being formed without interstitial layers between them, such interstitial layers could alternatively be formed without departing from the scope of the disclosure. Second spacer layer 212 may comprise, for example, oxide, hardened photoresist, or other material that may be selectively removed. That is, second spacer layer 212 can be selectively removed using any number of processes, such as, for example, by performing a plasma-ash that does not significantly affect hinge supports 207, hinge 220, or hinge layer 210.

Forming second spacer layer 212 may be effected through any of a variety of processes. In one non-limiting example, second spacer layer 212 can be formed by depositing an oxide or photoresist material. In some cases, second spacer layer 212 can be etched or polished back to a desired thickness, such as, for example, by using a chemical mechanical polish (CMP) technique. In various embodiment, second spacer layer 212 can comprise a final thickness of approximately 1 µm.

Forming mirror via 214 may be effected through any of a variety of processes. For example, mirror via 214 may be formed by removing substantially all of a portion of second spacer layer 212. In this particular embodiment, mirror via 214 is formed by patterning and etching second spacer layer 212 using photoresist mask and etch techniques. In this example, mirror via 214 is formed by patterning spacer layer 212 with a 1:1 aspect ratio. That is, the outermost width of mirror via 214 is approximately the same as the thickness of second spacer layer 212. Although an aspect ratio of 1:1 is used in this example, any other appropriate aspect ratio may be used without departing from the scope of the disclosure.

Figure 2F:
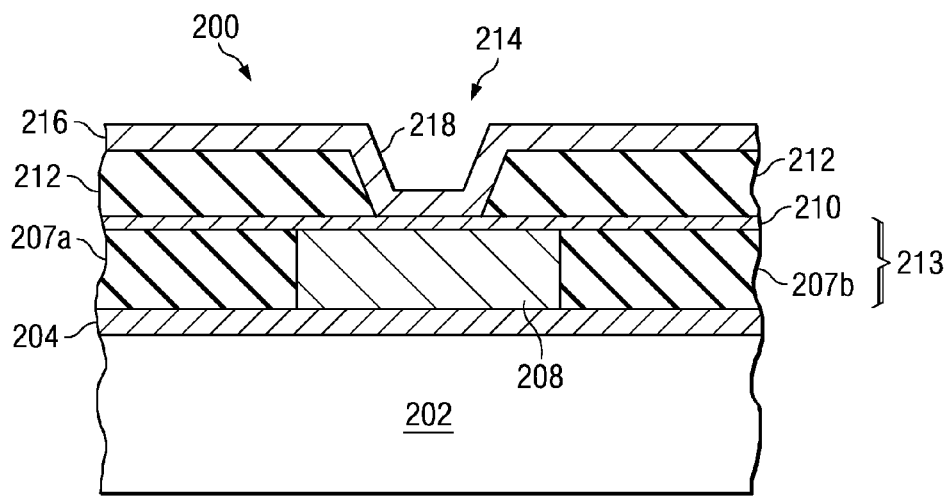

FIG. 2F shows DMD 200 after formation of a third conductive layer 216 outwardly from second spacer layer 212 and after formation of a mirror post 218 within conductive layer 216. Although third conductive layer 216 and second spacer layer 212 are shown as being formed without interstitial layers between them, such interstitial layers could alternatively be formed without departing from the scope of the disclosure.

Third conductive layer 216 may comprise, for example, aluminum, silicon, polysilicon, tungsten, nitride, and/or a combination of these or other materials. In this example, third conductive layer 216 comprises a reflective material, such as, for example, aluminum, an aluminum alloy, or any other appropriate reflective material. Although third conductive layer 216 comprises a reflective material in this example, any other desired conductive material can be used without departing from the scope of the disclosure. Forming third conductive layer 216 may be effected through any of a variety of processes. For example, third conductive layer 216 can be formed by depositing an aluminum alloy. In one non-limiting example, third conductive layer 216 can be formed by depositing aluminum to a thickness of 3300 angstroms.

At some point, one or more micromirrors are formed within third conductive layer 216. Forming the micromirrors may be effected through any of a variety of processes. For example, the micromirrors may be formed by removing a portion of third conductive layer 216. In this particular embodiment, the micromirrors are formed by patterning and etching third conductive layer 216. In various embodiments, the micromirrors formed in third conductive layer 216 can be substantially similar in structure and function as micromirror 116 of FIG. 1.

Conventional DMDs typically have spacer layers comprised of photoresist with contours that are substantially affected by inwardly disposed layers.

Unlike conventional DMDs, spacer layers 208 and 212 that are comprised of oxide may be polished back to remove the contour effects of inwardly disposed layers. This feature serves to prepare a much more flat surface for hinge layer 210, hinge 220, and third conductive layer 216 resulting in a relatively flatter micromirror. In some cases, a relatively flatter micromirror can advantageously enhance the optical performance of DMD 200. In other cases, a relatively flatter hinge profile near can minimize the effects of process variation.

Those skilled in the art to which the invention relates will appreciate that modifications may be made to the described embodiments, and yet other implementations realized, within the scope of the claimed invention.

What is claimed is:

1. A method for forming a MEMS device including a mirror, comprising:
    forming a dielectric layer over a substrate;
    forming a first metal conductive layer over the dielectric layer;
    patterning and etching the first metal conductive layer to define first electrodes and hinge supports separated by first openings formed in the first metal conductive layer;
    forming a selectively removable first spacer layer over the patterned and etched first conductive layer including within the first openings;
    planarizing the first spacer layer down to the first metal conductive layer, leaving the first spacer layer with a planarized first surface substantially even with a thickness of the first electrodes and hinge supports;
    forming a second metal conductive layer over the first electrodes and hinge supports and over the planarized first surface of the first spacer layer;
    patterning and etching the second metal conductive layer to define second electrodes and a hinge including spring tips;
    forming a selectively removable second spacer layer over the patterned and etched second metal conductive layer;
    planarizing the second spacer layer to provide a planarized second surface;
    patterning and etching the second spacer layer to provide a mirror via opening;
    forming a third metal conductive layer over the planarized second spacer layer including within the mirror via opening;
    patterning and etching the third metal conductive layer to define a mirror.

2. The method of claim 1, wherein the first and second spacer layers are planarized using chemical mechanical polishing.

3. The method of claim 2, wherein the first and second spacer layers are oxide layers.

4. The method of claim 1, further comprising removing at least portions of the first and second spacer layers following defining the mirror.

* * * * *